(12) United States Patent
Metaxas (10) Patent No.: US 9,596,752 B2
(45) Date of Patent: Mar. 14, 2017

(54) PANEL WITH ELECTRIC DEVICES

(71) Applicant: Ambianti B.V., Eindhoven (NL)

(72) Inventor: Georgios Metaxas, Eindhoven (NL)

(73) Assignee: AMBIANTI B.V., Eindhoven (NL)

( * ) Notice: Subject to any disclaimer, the term of this patent is extended or adjusted under 35 U.S.C. 154(b) by 297 days.

(21) Appl. No.: 14/464,006

(22) Filed: Aug. 20, 2014

(65) Prior Publication Data

US 2014/0355220 A1  Dec. 4, 2014

Related U.S. Application Data

(63) Continuation of application No. PCT/NL2013/050104, filed on Feb. 19, 2013.

(30) Foreign Application Priority Data

Feb. 20, 2012 (NL) ..................................... 2008316

(51) Int. Cl.
*H05K 5/00* (2006.01)
*H05K 1/02* (2006.01)
(Continued)

(52) U.S. Cl.
CPC ......... *H05K 1/0292* (2013.01); *G06F 3/1446* (2013.01); *G09G 3/20* (2013.01); *G09G 3/2085* (2013.01); *H05K 3/0052* (2013.01); *G09G 3/2088* (2013.01); *G09G 2300/026* (2013.01); *G09G 2300/0426* (2013.01); *G09G 2310/0278* (2013.01); *G09G 2310/0281* (2013.01);
(Continued)

(58) Field of Classification Search
CPC ... H05K 1/02; H05K 1/11; G02F 1/13; G09G 3/20; G09G 3/28; G09G 3/32; G09G 3/36
USPC ..... 361/825, 730; 174/254; 345/60, 87, 690, 345/691; 349/61
See application file for complete search history.

(56) References Cited

U.S. PATENT DOCUMENTS

| 2002/0117328 A1* | 8/2002 | Oishi .................. G02F 1/13452 174/254 |
| 2005/0057580 A1* | 3/2005 | Yamano ............... G09G 3/3241 345/690 |

(Continued)

FOREIGN PATENT DOCUMENTS

| EP | 2085955 | 8/2009 |
| JP | 2011-158703 | 8/2011 |

(Continued)

*Primary Examiner* — Xiaoliang Chen
(74) *Attorney, Agent, or Firm* — Peacock Myers, P.C.; Jeffrey Myers (57) ABSTRACT

A panel of rectangular shape comprising a plurality of electric devices spread over the panel, a control unit including a microprocessor and a power supply, drivers for driving the electric devices based on control information received from the control unit and electric wiring connecting the control unit, the drivers and the electric devices, the shape of the panel being adaptable by removing one or more parts of the panel by cutting, sawing, milling, drilling or other suitable methods, wherein the control unit and the drivers are positioned closer to a first side of the panel than to a second side opposite the first side. The drivers and electric devices are partitioned into groups that each comprises one driver that exclusively drives the electric devices in that group.

14 Claims, 8 Drawing Sheets

(51) Int. Cl.
*G06F 3/14* (2006.01)
*G09G 3/20* (2006.01)
*H05K 3/00* (2006.01)

(52) U.S. Cl.
CPC . *G09G 2330/08* (2013.01); *G09G 2340/0492* (2013.01); *G09G 2360/141* (2013.01); *G09G 2370/18* (2013.01); *H05K 1/0286* (2013.01); *H05K 2201/09972* (2013.01); *H05K 2201/10507* (2013.01)

(56) References Cited

U.S. PATENT DOCUMENTS

| | | | |
|---|---|---|---|
| 2005/0088386 A1* | 4/2005 | Kao | G02F 1/13624 345/87 |
| 2005/0200563 A1* | 9/2005 | Kim | G09G 3/2022 345/60 |
| 2009/0109247 A1* | 4/2009 | Kimura | G09G 3/3666 345/690 |
| 2009/0278869 A1* | 11/2009 | Oishi | G09G 3/2025 345/691 |
| 2012/0257140 A1* | 10/2012 | Shimizu | G02F 1/133603 349/61 |

FOREIGN PATENT DOCUMENTS

| | | |
|---|---|---|
| WO | 01/46749 | 6/2001 |
| WO | 02/43044 | 5/2002 |
| WO | 2008/120132 | 10/2008 |
| WO | 2010/136998 | 12/2010 |
| WO | 2013/125949 | 9/2013 |

* cited by examiner

PANEL WITH ELECTRIC DEVICES

CROSS-REFERENCE TO RELATED APPLICATIONS

This application is a continuation application of Patent Cooperation Treaty Application No. PCT/NL2013/050104, entitled "Panel with Electric Devices", filed on Feb. 19, 2013, which claimed priority to Netherlands Patent Application No. 2008316, filed on Feb. 20, 2012, and the specifications and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

The present invention relates to a panel of rectangular shape comprising a plurality of electric devices spread over the panel, a control unit including a microprocessor and a power supply, a plurality of drivers for driving the electric devices, based on control information received from the control unit and electric wiring connecting the first control unit, the plurality of drivers and the electric devices, the shape of the panel being adaptable by removing one or more parts of the panel by cutting, sawing, milling, drilling or other suitable methods. The invention also concerns a building structure compiled of several such panels.

2. Description of Related Art

Panels with electric devices are known, for instance to cover walls or ceilings. Several types of electric devices may be installed at such panels. However in the known panels these electric devices usually concern electric light elements, in particular light emitting diodes. The panels with electric devices are supplied as prefabricated components with a certain shape, in general as square or rectangular tiles, and with certain dimension. The wall or ceiling, or any other building part of destination, may have a shape, for instance slanted sides and corners, and/or dimension that do not fit the shape and dimension of a panel or a multiple of panels. In particular the building may have construction elements, such as columns, beams or tubes, which interfere with parts of the panel. For this reason the panel needs to be adaptable to the building. However by cutting the panel to the required shape, essential parts may be removed or disconnected. This is of course unacceptable since after cutting the remaining electric devices should still function. Therefore the control unit should be such that optimal flexibility is obtained with respect to the possibility to shape a panel around an obstacle by removing part of the panel, while the functions of the remaining part of the panel remain unimpaired.

A display panel that addresses to some extent the problem of adaptability is for instance known from EP2085955. The electric devices of this known panel are light emitting elements, in particular light emitting diodes (LEDs). The panel is a PCB (printed circuit board) board and is used for (large area) displays. The panel of EP2085955 suggests a scheme where a control unit, centrally placed in the panel, contains the drivers of the light emitting elements, allowing parts of the periphery of the panel to be removed without impeding the functionality of the remaining panel. Thus the area of the panel that can be cut is directly related to the extents of the control unit which contains the drivers. This requires that the drivers are placed as close as possible to each other, but then this design might lead to thermal management problems especially when such a panel installation is used for primary lighting with high current light emitting elements.

Furthermore, this prior art suggests that when a diagonal cut or any other cut going through the control-unit, and hence the drivers, needs to be made to accommodate an obstacle, the control-unit should be first unmounted from the panel which then can be cut, and then the drivers of the control-unit may be reconnected to the light emitting elements. This problem makes in-situ installation of such panels quite demanding.

When an area larger than the removable periphery needs to be cut out, this is then in certain cases also possible by first "trimming" part of the panel in order to bring the control-unit outside the desired cutoff line, and then cut the remaining part to the desired shape; however such an approach would lead to a number of clear disadvantages:

firstly it would require more panels than the optimal number to be used, while also due to the additional cuts, considerable design effort during in situ installation is required.

secondly it would result in a non-edge-to-edge tiling of the panels covering the target surface, as a panel could result having on the same side two neighboring panels. This problem is not only related to the aesthetic result, but it may further require a far more complex panel configuration and interconnection scheme.

finally, depending on the dimensions of the control unit and the target obstacle, the neighboring light emitting elements of two panels could end up in uneven distances compared to the rest of the light emitting elements, thus causing an undesirable aesthetic result.

WO 2010/136998 describes a cut to measure display device comprising a plurality of pixel groups and a main controller. Each pixel group comprises one subcontroller and a plurality of individually controllable pixels that all are connected to the subcontroller of the group and at least one is further connected to a subcontroller of an adjacent group. Although when such a display device is being cut, there is a potential backup, it is not possible to predict when cutting if functionality is being lost or not. Thus it requires complex software to be run to ensure the optimal usage of the backup connections that are available, while there is still no guarantee that no functionality is being lost. This makes in situ adaptation of the shape of the display device very difficult if not impossible. Also the device comprises a rather complicated electric wiring scheme, thus rendering the need of a PCB (printed circuit board) covering the whole surface of the panel a necessity. This significantly increases the cost of production compared to the optimal PCB usage, especially when the electric devices (light emitting elements) are forming a sparse pattern.

The present invention intends to solve several of the problems of the prior art as described above and in particular intends to provide a panel with electric devices that allows for a large variety of shapes being removed from the panel without impairing the functionality of the remaining electric devices, and at the same time allows predictability for any shape of cutout if there will be loss of functionality of the electric devices.

BRIEF SUMMARY OF THE INVENTION

The present invention is of panel of rectangular shape comprising a plurality of electric devices spread over the panel, a control unit including a microprocessor and a power supply, drivers for driving the electric devices based on control information received from the control unit and electric wiring connecting the control unit, the drivers and the electric devices, the shape of the panel being adaptable by removing one or more parts of the panel by cutting, sawing, milling, drilling or other suitable methods, wherein the control unit and the drivers are positioned closer to a first side of the panel than to a second side opposite the first side. The drivers and electric devices are partitioned into groups that each comprises one driver that exclusively drives the electric devices in that group.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 3 shows the front side (FIG. 3a) and the position of the control units (FIG. 3b) of a building structure in particular for covering a ceiling;

FIG. 8 is a planar view (FIG. 8a) and a cross section (FIG. 8b) of a preferred embodiment of a panel according to the invention.

DETAILED DESCRIPTION OF THE INVENTION

The panel with electric devices according to claim 1 fulfills the stated intentions above. First of all because of the clear split between the control unit and the drivers, the only part that may not be cut away is the part containing the control unit, thus minimizing the non-removable area. Any other part of the panel according to the invention may under certain conditions be part of a removable region and may thus be removed without impairing the function of the remaining electric devices. According to claim 1 there is one driver in each group that drives all electric devices of that group. This means that also drivers may be removed as long as all electric devices of the group are also removed. The specifications according to claim 1 of the groups have a few consequences for the layout. It means that the drivers are spread along a direction that essentially follows the direction of the first side and the group boundaries or rather the convex area that contains the driver as well as the electric devices are oblong areas that essentially run from the first side to the second side opposite the first side, but on both sides a limited deviation towards one of the other sides is allowed. This deviation is limited by the requirement of convexity of the areas surrounding each group. A case can be considered in which not all convex areas round the groups have to border to the second side opposite the first side of the panel in addition to bordering at the first side, but can also instead of bordering at the second side bordering at one of the other two sides. This is the case for instance when the pattern of distribution of the electric devices of the panel is not as regular but shows a bit of a diverging pattern towards the sides if going away from the first side. Notably the outermost groups, i.e. the leftmost and the rightmost group are now possibly no longer bordering on the side opposite the first side but in addition to bordering the first side are now bordering to one of the sides adjacent to the first side. Still the same freedom of cutting lines exists in this configuration, without impairing the functionality of the panel part that remains after the cut.

The removable area is now in an easily understandable way defined using the following example. In this example all drivers are aligned parallel to the first side of the panel and this line through the drivers is considered as x-axis of a x-y coordinate system. Then with a few simple restrictions, any conceivable line $y=f(x)$ may be a cutting line for the panel. The restrictions being that, as stated before, the control unit may not be part of the removable region and that when a driver is removed the whole group needs to be removed. The functional requirement means in practice that with respect to the x-axis the cutting line may not return on itself. This gives an enormous flexibility in removable area, as will be demonstrated later with certain examples. It should be kept in mind that both the control unit and the drivers are situated eccentric, in the panel half closest to the first side. This means that it is possible if required to mount a panel in a certain position in two ways that are rotated over 180° with respect to each other. When the panel happens to be not only of rectangular shape, but also of a square shape, then the panel can be mounted in four different ways, being rotated over plus or minus 90° as well as 180° with respect to a starting position. This makes the possibility to accommodate an obstacle by removing part of the panel without impairing its functionality even greater and more flexible because it utilizes rotation in favor of cuttability as an explicit additional degree of freedom. Obstacles of almost any size and shape can be accommodated by panels according to the invention in such a way, that the cut away part of the panel is facing the obstacle and thus always having uncut sides of the panels bordering uncut sides of neighboring panels. It is also clear that not only does a panel according to the invention as defined by claim 1 allow for substantially more flexibility than the state of the art, but also it is possible to know from the outset how the panel may be cut without impairing its functionality. This is also a considerable advantage over some of the prior art.

From the above it can also be concluded that the flexibility of removing parts of the panel according to the invention increases when the first drivers and also the control unit are closer to the first side. In other words the more eccentric they are the better. When the first drivers are as close to the first side as the closest to the first side electric device of the group, the possibilities for removing parts of the panel are close to optimal; the optimal situation being when the first drivers are closer to the first side than any of the electric devices of the group. However practical circumstances such as physical space and possibilities for positioning the drivers and the control unit may limit how close it is possible to approach the optimal design.

A panel according to the invention allows for incorporation of a wide range of electric devices, which can be chosen from a group comprising a LED, another electric light element, a position sensor, a motion sensor, a fire detection sensor, a speaker, a microphone, a light sensor, and a combination of these. This allows for many combinations with advantageous properties in specific applications. Examples may include indoor positioning and guidance systems, intelligent security alarm systems, adaptable lighting systems, distributed computing systems, smart grid speaker systems and so on.

Another possibility to optimize the flexibility for removing parts of the panel is obtained when the first control unit is positioned closer to one corner of the first side of the panel than to the other. Simply said the closer to a corner the more flexible are the possibilities for cutting away larger parts of the panel. However the angle of the smallest possible angular cut starting from that corner becomes bigger. A preferred placement of the control unit is therefore somewhere between the center of the first side and a corner.

In a special embodiment of the invention, the panel is arranged such that each group further comprises a second driver, arranged to drive only electric devices in that group, the second driver being positioned in the convex area belonging to that group, wherein the second drivers are positioned closer to the second side of the panel (2) than to the first side. This embodiment of a panel according to the invention may be used in cases where e.g. a hole has to be drilled in the panel and the hole severs the connection between a driver and one or more electric devices, such devices may then be driven by the second driver of this embodiment. When the drivers are provided with circuitry to detect open loops, it can be arranged such that the function of the first driver is automatically taken over by the second driver if the first driver is cut off. Furthermore, the presence of the second driver in each group near the second side, allows significant improvement of thermal dissipation in high-current demanding situations by reducing the duty-cycle of the drivers to 50% as the electric devices of each group can be selectively driven either from the first or the second driver, under control of the control unit.

In another execution of the embodiment discussed in the previous paragraph, the panel further comprises a second control unit, placed (opposite to the first control unit and) closer to the second side than to the first side. In particular when the first drivers are controlled from the first control unit and the second drivers are controlled from the second control unit, then it is possible to divide the panel into two independent panels. This can with advantage be used when two panels need to be cut that also can be replaced by this one panel cut in two. The panel might be slightly more expensive, but it would still be more economic than to use two panels for the same space.

It is of further advantage in a panel according to the invention, when each of the drivers inside their convex area is located as close as possible to the control unit at the same side of the panel; i.e. to place the drivers of groups on the left of the control-unit as right as possible within the group, and the drivers of groups on the right of the control-unit as left as possible within the group. Then the possibility that a driver is being cut while not all electric devices driven by that driver have also been cut is minimized.

The placement of the first control-unit and the first group drivers along the first side of the panel, allows essentially these components to be assembled on a narrow PCB-stripe. On the other hand the electric device connection scheme allows the connections of the drivers to the electric devices to be done using raw electric wiring thus reducing dramatically the cost of materials. Furthermore, in a preferred embodiment, the panel according to the invention comprises a base plate on which the electric devices are mounted, while the PCB stripe, which is mounted standing on the face plate, and the electric wiring from each of the drivers to the electric devices lie in a plane perpendicular to the base plate. As the electronic components have a profile of few millimeters, the perpendicular mounting of the printed circuit board with the control unit and the drivers minimizes the projected area on the panel occupied by components and thus maximizes the removable area. The same is true for the vertical arrangement of the wiring from drivers to their electric devices; that is collinear electric devices of a group can be connected to their group driver with wiring that lies in a plane perpendicular to the base plate. A further advantage is obtained when the PCB and wiring from the drivers to the electric devices are molded in with a suitable resin. This enhances structural stability, and depending on the resin properties, thermal dissipation.

To facilitate the option to rotate a panel in its position between adjacent panels it is of advantage when the control unit comprises a communication unit and is connected to a connector set at each of the perimeter sides of the panel for connection to an adjacent panel. This means that communication with adjacent panels is always possible.

In an advantageous embodiment of the invention the control unit comprises a position and/or orientation and/or shape determination component. Such panel is able to determine its position in relation to other panels in a building system. Such panel provided with a determination component may also determine its shape after cutting and in particular which devices and at which position are still present after cutting, e.g., by having drivers equipped with open circuit detection, as mentioned before. The communication device as part of the control unit enables the panel according to the invention in particular to communicate its position and/or orientation and/or shape and/or to receive control information and/or to communicate information to and/or from the electric devices and/or to receive similar information of other panels. In this way the panels, when compiled in a building structure, such as a ceiling, wall or floor, may mutually communicate their positions, orientations and shapes. In particular the freedom of orientation provides considerable convenience in cutting and assembling. As the panels can be rotated in arbitrary orientations, neighboring edges of any two panels are always assured to be edges of the original panels before cutting to shape. Therefore these intelligent panels are easy to cut and to assemble an edge-to-edge tilling forming a building structure, with predetermined aesthetic results; that is maintaining a predetermined distance of the electric devices of adjacent tiles when symmetrical device pattern is concerned such as a regular grid. The building structure as such can be easily controlled as all panels, their position, orientation and shapes are known. Consequently also all available devices and their individual position are known. Also communication with individual devices may be possible.

The building structure according to the invention is compiled of one or more panels. Through the communication ability as described before, the panels are mutually self-configuring to a controllable structure. When the intelligent panels are compiled they may self-start their configuration in the building structure so that the building structure as a whole is configured and the structure may behave and be controlled as one system. The self-configuration provides, independent of the applied reference point, the same map which makes it easy to control. The structure may be controlled by wire; however the structure is preferably controlled wirelessly.

The various aspects of the invention will now be described in more detail and will be elucidated, by way of example only, with reference to the accompanying drawings.

Figure 1:
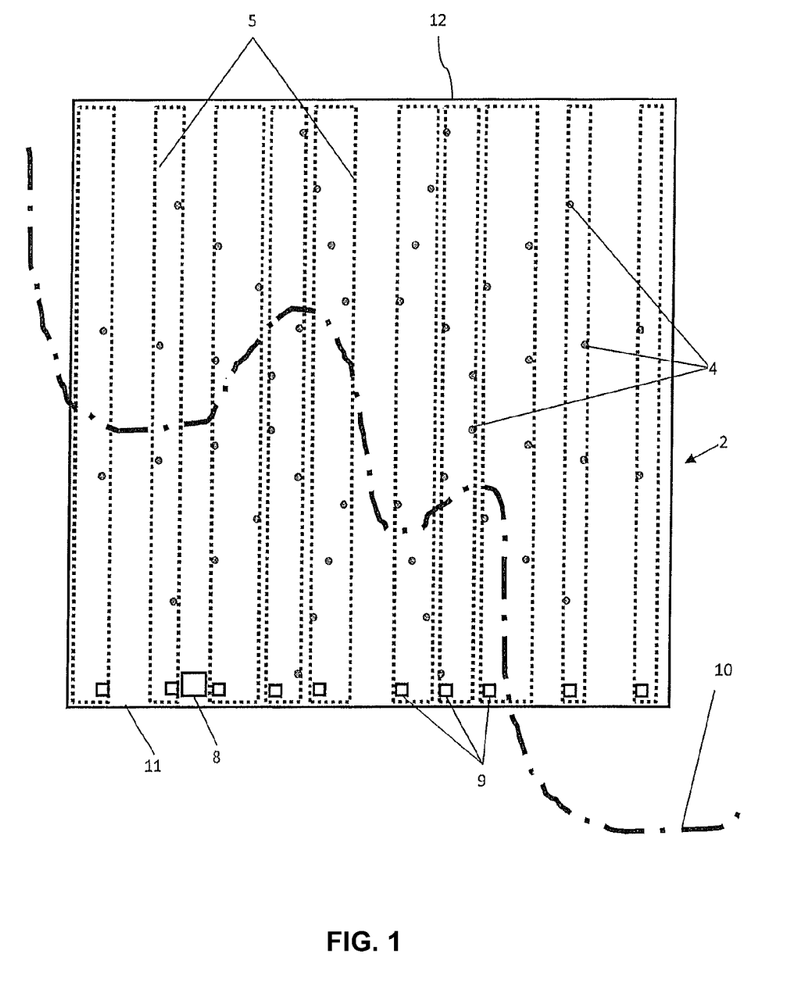
FIG. 1 shows a first embodiment of a panel according to the invention.

FIG. 1 shows the first embodiment of a panel 2 according to the invention. Panel 2 comprises a plurality of electric devices 4 that are spread over the surface of the panel 2. In the figure the lower side of the panel is the so called first side indicated by 11. Along the first side are shown a number of drivers 9 who are each driving a number of electric devices 4. Each electric device 4 is only driven by one driver 9. It should be noted that when a multitude of the same objects are present in a figure, not always each individual object is indicated by a reference number, but only one or a few of these objects are indicated. This is to keep the figures clear and easy to read. It can be noticed that the drivers 9 are closer to first side 11 than any of the electric devices 4 driven by that particular driver 9. Also located close to first side 11 is control-unit 8 that is connected to each of the drivers 9. Control-unit 8 at least comprises a multiprocessor and a power distribution unit. Each of the drivers 9 drives electric devices 4 connected to it, however based on instructions received from control-unit 8. The drivers 9 and the plurality of electric devices are partitioned into groups and each group comprises one driver driving exclusively the electric devices of that group. A convex area 5, which is indicated in FIG. 1, around each group can be created being delimited by the dotted lines. The convex areas 5 all are forming rectangles with the longest side perpendicular to first side 11 of panel 2. The convex areas 5 are stretching out from the first side 11 to the second side 12 opposite the first side 11 of the panel. The conditions given by claim 1 ensure an extremely high flexibility in the way a panel 2 according to the invention can be adapted in shape by removing parts of it, without impairing the functionality of the remaining part. This flexibility in adapting the shape is only limited by a few simple conditions which are following from the conditions imposed by the characteristics claim 1. The first condition is that control-unit 8 may not be part of the removed area. The second restriction is that if a driver 9 is being removed then also all electric devices (4) of that group must be removed. This even enhanced by the fact that all drivers are positioned in their respective convex area in such a way that they are, with respect to the direction parallel to the first side 11, as close as possible to the control unit 8. And finally if an electric device 4 from a group is being removed then of that group also all electric devices beyond that removed electric device, as seen from the position of the driver 9 need to be removed since their connection to the driver 9 is likely to be severed.

Figure 2:
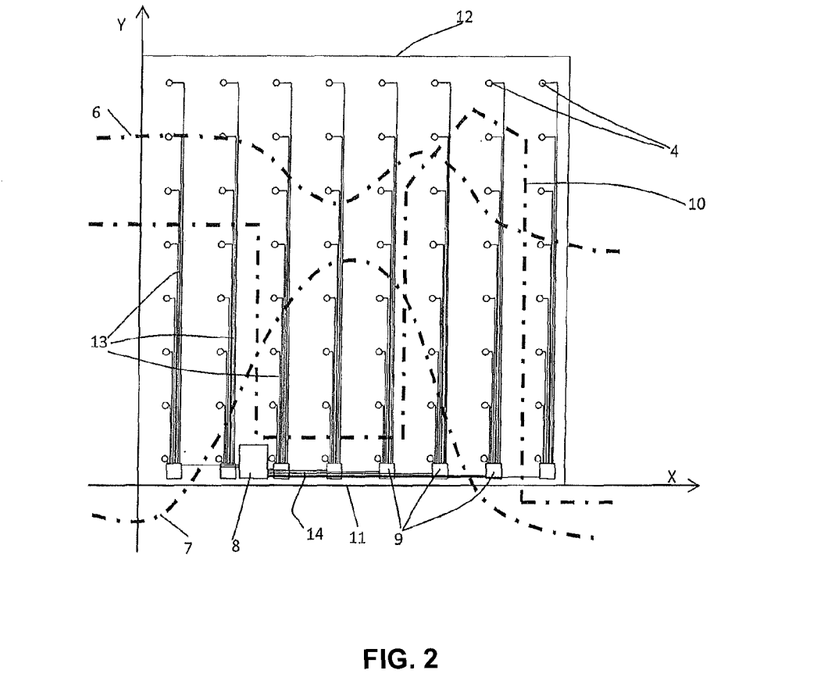
FIG. 2 illustrates removability of the panel of FIG. 1.

What these conditions for removability mean in practice is in a simple way illustrated in FIG. 2. FIG. 2 is similar to FIG. 1 with the addition that around the panel 2 a Cartesian coordinate system X-Y is being drawn of which the X-axis is parallel to first side 11 and Y-axis runs along the left side of the panel. Any function y=f(x) can now serve as a cutting line as long as it keeps control-unit 8 as part of the panel and as long as the cutting line has at maximum one cut through first side 11 left of the control-unit 8 and at maximum one cut through first side 11 right of the control-unit 8. If that restriction is fulfilled then any line representing a function y=f(x) is permitted as a cutting line. A number of cutting lines 6, 7, 10 have been indicated for illustration in FIG. 2.

Figure 3:
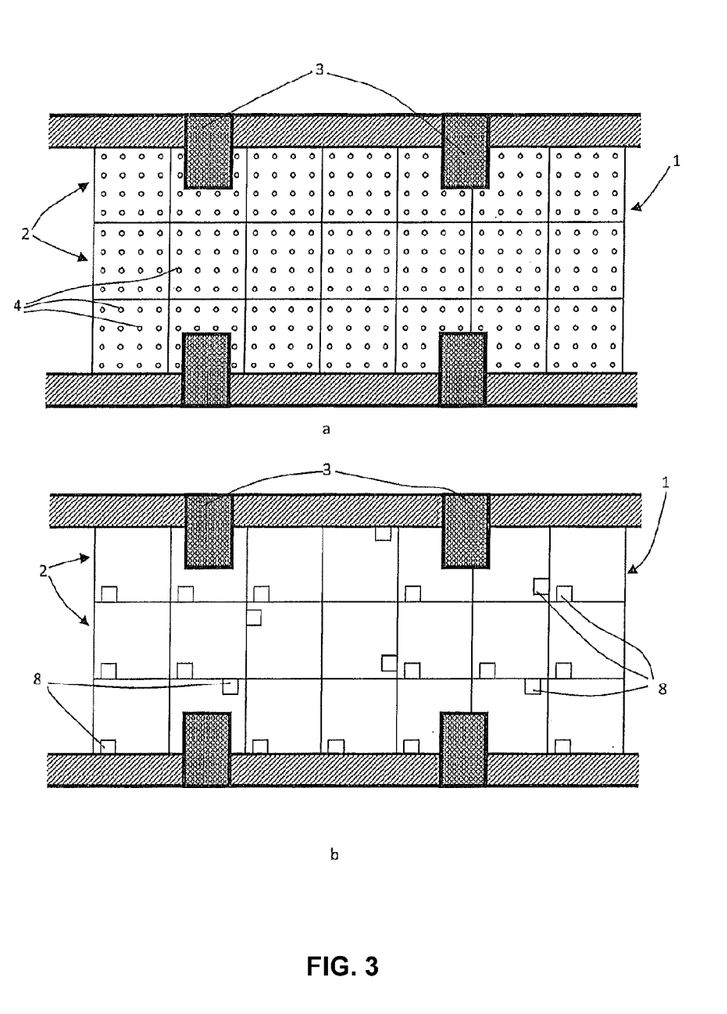

In FIG. 3a, a building structure 1 is shown. The building structure 1 is in this case applied as a ceiling. Several other applications are possible such as wall covers, floor covers or displays. The building structure 1 consists of twenty-one panels 2 according to the invention. The panels 2 comprise multiple electric devices 4. The electric devices 4 may for instance be lighting elements, in particular light emitting diodes (LEDs), sensors of indoor positioning systems, parts of alarm systems, in particular of fire alarms, or monitoring systems, etc. Not shown in this figure, however further elucidated in several of the other figures, the electric devices are connected with an electric wiring. The electric wiring connects the electric devices with a control unit 8 via drivers 9. The control unit 8 controls the electric devices of a panel. In general the control unit 8 will also connect the panel to an external source of power and to one or more of the other panels of a building structure.

The building structure 1 interferes with building elements 3. These building elements 3 protrude from a ceiling In order to accommodate to the protrusions 3, the panels 2 have been shaped to fit around the protrusions by rotating and then cutting out parts of the panels 2. By cutting, the electric wiring or the control unit of the panels may be disturbed, which may impede functioning of one or more electric devices 4. Accordingly the shaping of panels is restricted. FIG. 3b, illustrates the position of the control units 8 of the same compilation of panels, and explains how the placement of the control unit 8 of each panel supports the solution to this problem. The decentralized placement of the control units 8 of the panels 2, allows the panels 2 to be cut to shape and rotated so that they accommodate the building elements 3. In this compilation, if instead the control units were located in the center of the panels it would have been impossible to fit around the obstacles using the same number of panels, or without introducing in general a more complex installation methodology. Nevertheless, the decentralized placement of the control units 8 makes it possible to cover the ceiling surface with fewer cuts, compared to prior art. On the other hand the panels 2 that are not affected by the protruding elements can also be placed in an arbitrary orientation, thus allowing the panels to be placed in edge-to-edge tiling, while also making the installation simpler and less prone to errors. In addition, it is easy, e.g., by placing a blue print on the backside of the panel indicating the underlying position of the control unit 8 and the connections, from which it is clear what parts may be removed by cutting. This is a major advantage at a building site, as opposed to complicated wiring schemes where the abovementioned solution would not be as beneficial; in such cases it would have resulted most likely in large losses due to scrapping of valuable panel material or costly repairs due to wrong cutting caused by the complicated instructions.

Figure 4:
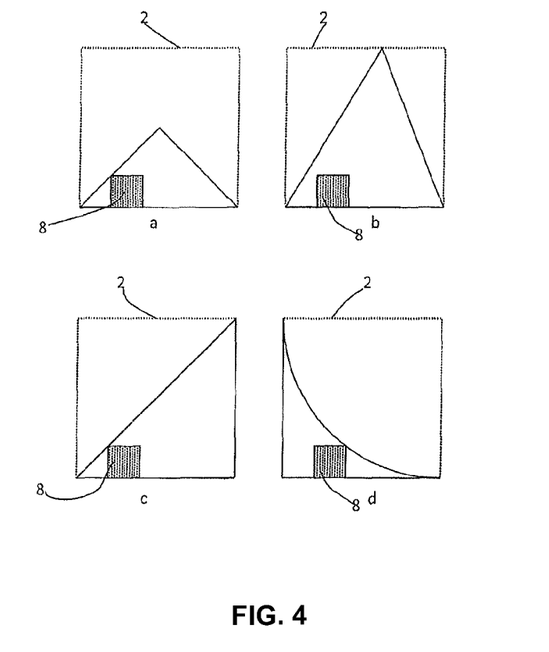
FIG. 4 is a schematic presentation of the position of the control unit of a panel according to the invention with the control unit near the corner with different cutting lines (4a, 4b, 4c and 4d)
Figure 5:
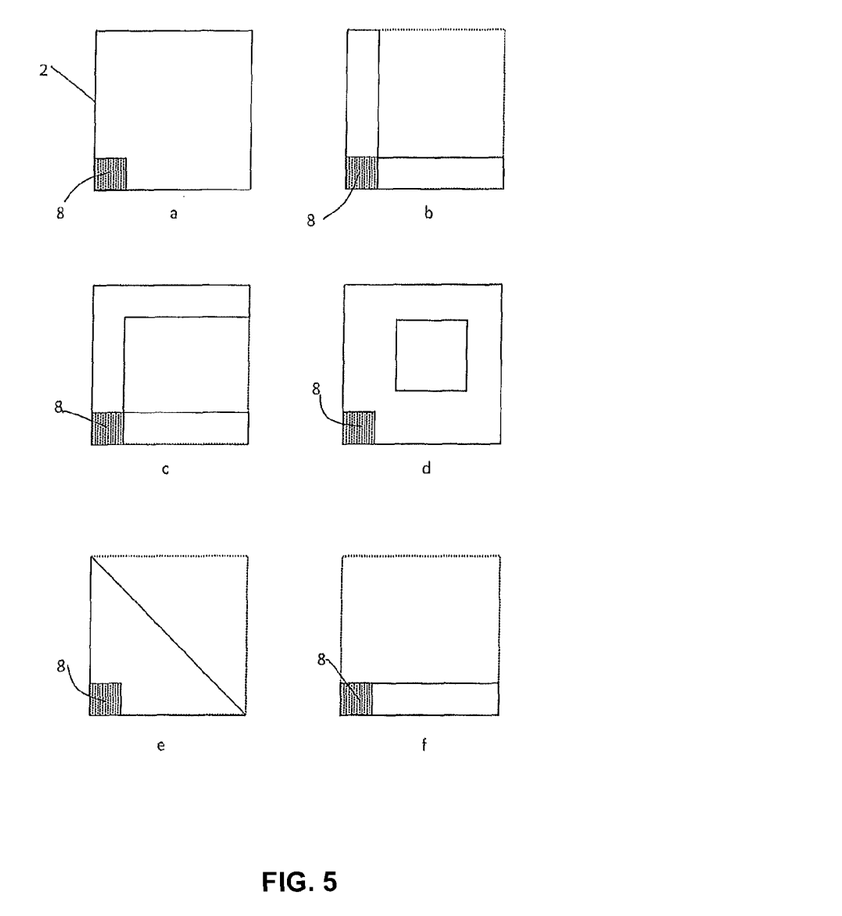
FIG. 5 is a schematic presentation of panel cut-outs in a variety of different shapes (5a, 5b, 5c, 5d, 5e and 5f)

In FIG. 4 the position of the control units 8 of a panel according to the invention is shown. The control unit 8 is positioned near one of the sides of the panel 2. By positioning the control unit 8 near a side, a considerable part of the panel 2 may be cut and removed without impeding the function of the control unit 8. As can be seen, the control unit 8 is not only positioned near a side, however also near a corner of the panel 2. This further improves freedom of shaping the panel 2. The control unit 8 may of course also be positioned in the corner, however according to the invention it is beneficial to position it near the corner. In this way the frequently used cutting from the corner, as shown in FIGS. 4a, 4b, 4c and 4d is possible without impeding the functionality of control unit.

In the FIGS. 5b-f, as example, several shapes are shown that are possible with the control unit 8 positioned at a side, possibly near or in the corner. These shapes are cut out a square panel 2, for instance a tile, as shown in FIG. 5a. Of course these shapes are only possible if also the electric wirings are still operative for all electric devices 4 on the non-removed part of the panel 2. Moreover, in order to obtain the optimal shape, in general fewer cuts are required which enhances an efficient utilization of the panel 2.

Figure 6:
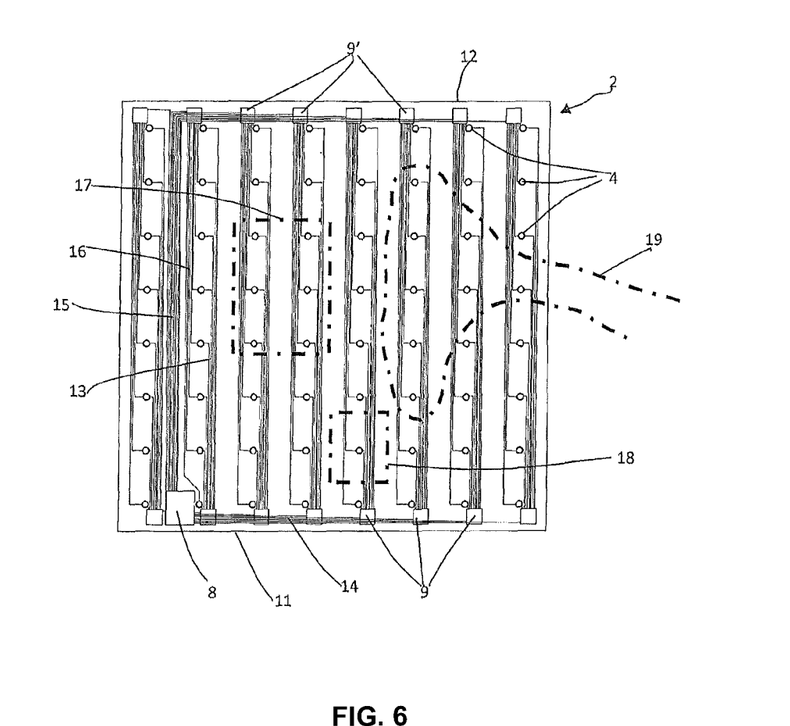
FIG. 6 shows a second embodiment of a panel according to the invention with the drivers at two opposite sides of the panel.

Additional freedom in shaping may be obtained in another embodiment of a panel 2 according to the invention, by providing an additional row of drivers 9' along the second side 12 opposite the first side 11 of the panel 2 and connected by an additional wiring to the control unit 8, as is shown in FIG. 6. In this way each electric device 4 is from both opposite sides approached by wirings 13 and 16 of the electric wiring. When a connection from one side is interrupted by a cut, the electric device may still be connected with the control unit 8 by the wiring from the other side. Cutting lines 17, 18 and 19 show complicated cut outs, in particular also an internal cut out, that are possible within this specific embodiment.

Figure 7:
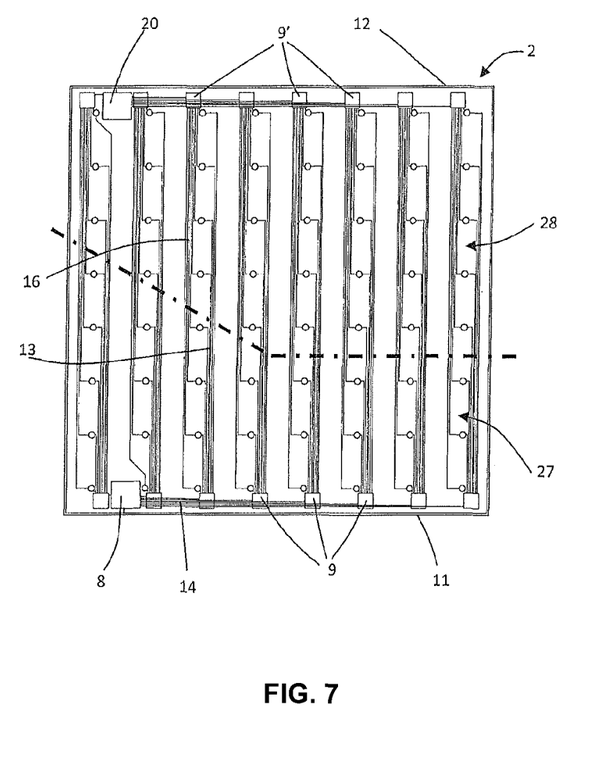
FIG. 7 shows a third embodiment of a panel according to the invention similar to the layout of FIG. 6, but with two control units.

In a further embodiment of the invention the freedom to shape the panel 2 may further be improved by connecting a first control unit 8, connected to drivers 9 along the first side of the panel, to a second control unit as shown in FIG. 7. The control unit 8 will control all the drivers 9, the other control unit 20 controls the second drivers 9'.

The application of a second control unit 20 as shown in FIG. 7 has, however, an important advantage. When the panel 2 is cut along indicated cutting line 18, both the non-removed part 27 and the removed part 28 are still provided with control units 8 and 20 respectively, and may both function independently. Accordingly even the removed part 28 may still be applied at a suitable place as yet another adaptable panel. In this way all of the panel 2 may be used in an optimal way, thus reducing costs. This embodiment becomes more interesting and economically advantageous when the cost of the electric devices 4 is getting a more dominant part of the total panel 2 cost.

Figure 8:
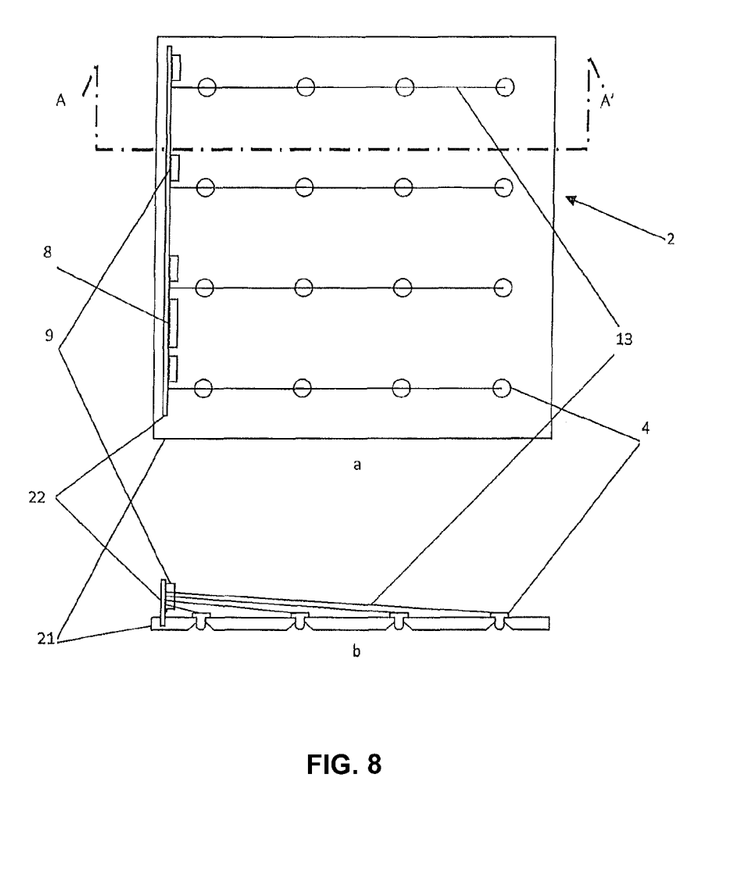

FIG. 8a shows a top view of the rear side of a panel 2 in a referred embodiment of the invention. FIG. 8b shows a cross section along the line AA' shown in FIG. 8a. The panel 2 comprises a base plate 21 on which the electric devices 4 have been mounted. The control unit 8 and drivers 9 are mounted on a printed circuit board 22. The printed circuit board 22 also comprises the electric connections between the control unit 8 and drivers 9. As can be seen in FIG. 8b, the printed circuit board 22 is mounted standing on, i.e. perpendicular to base plate 21. This means that the area of panel 2 occupied by control unit 8 and drivers 9 is minimized thus increasing the area that can be removed and thus adaptability of the panel 2. It can also be seen that for each of the drivers 9 the electric wiring 13 that connects the drivers 9 with the appropriate electric devices 4 is lying in a plane perpendicular to the base plate, which again enhances adaptability of the panel 2. Not shown in FIG. 8 is that the printed circuit board 22 and the electric wiring 13 are molded in with a suitable resin. The resin preferably fills the full shape of the panel 2 thus rendering stiffness as well as robustness to the panel 2.

In preferred embodiments of the panel 2 according to the invention, the control unit 8 also comprises determination means. When positioned, for instance in a wall covering, and connected to other panels 2, the determination means will determine it position and its rotational position with respect to the other panels 2. This provides a substantial flexibility. The panel may be positioned independent of the specific position of the control unit. The control units 8 are also provided with communication units to communicate with each other and to determine their position and function in the building structure. In a preferred embodiment such communication is wired via to a connector set at each of the perimeter sides of the panel 2 for connection to an adjacent panel. However instead or in addition this communication may also be wireless. This configuration of building structures with intelligent panels provides a plug-and-play system that is easily to control. For instance each panel may communicate its position and shape information to a control terminal, the configuration of the building system may be displayed at the terminal and an operator may control the building system with such terminal.

The follow is a list of the reference numbers employed in the specification and figures:
- 1 building structure
- 2 panel
- 3 building element
- 4 electric device
- 5 convex area
- 8 first control unit
- 9 first drivers
- 9' second drivers
- 6, 7, 10, 17, 18, 19, 25 cutting lines
- 11 first side of 2
- 12 second side of 2
- 13, 14, 15, 16 electric wiring
- 20 second control unit
- 21 base plate
- 22 printed circuit board
- 27, 28 panels after division To the person skilled in art it is obvious that the above given embodiments represent only a few of the many possible variations in which the adaptable panel according to the invention may be embodied. Therefore the embodiments given here must be understood as an elucidation to the appended claims without limiting the scope of the invention.

What is claimed is:

1. A panel of rectangular shape comprising:
   a plurality of electric devices spread over the panel;
   a first control unit including a microprocessor and a power supply;
   a plurality of first drivers for driving the electric devices, based on control information received from the first control unit; and
   electric wiring connecting the first control unit, the plurality of drivers and the electric devices, the shape of the panel being adaptable by removing one or more parts of the panel by cutting, sawing, milling, drilling or other suitable methods; and wherein the first control unit and the plurality of first drivers are positioned closer to a first side of the panel than to a second side opposite the first side and the first drivers and plurality of electric devices are partitioned into groups in such a way, that:

each group comprises one first driver that exclusively drives the electric devices in that group; and each group lies within a convex area that borders at the first side as well as at one of the remaining three sides preferably at the second side; and wherein the convex areas of the groups do not intersect.

2. The panel according to claim 1, wherein the first drivers are as close to the first side as the electric device of the group that is closest to the first side.

3. The panel according to claim 1, wherein the first drivers are closer to the first side than any of the electric devices of the group.

4. The panel according to claim 1, wherein each of the electric devices is chosen from the group consisting of an LED, another electric light element, a position sensor, a motion sensor, a fire detection sensor, a speaker, a microphone, a light sensor, and a combination of these.

5. The panel according to claim 1, wherein the first control unit is positioned nearer to one corner of the first side of the panel than to the other.

6. The panel according to claim 2, wherein each group further comprises a second driver, arranged to drive only electric devices in that group, the second driver being positioned in the convex area belonging to that group, wherein the second drivers are positioned closer to the second side of the panel than to the first side.

7. The panel according to claim 6, wherein the electric devices of each group can be selectively driven either from the first driver or from the second driver.

8. The panel according to claim 6, further comprising a second control unit, placed opposite to the first control unit and closer to the second side than to the first side and the first drivers are controlled from the first control unit and the second drivers are controlled from the second control unit, making the panel dividable into two independent panels.

9. The panel according to claim 1, wherein each of the drivers are within the limitations of their group located as close as possible to the first control unit and in case the panel comprises a second control unit, as closes as possible to the control unit at the same side of the panel.

10. The panel according to claim 1, wherein the panel comprises a base plate on which the electric devices are mounted and each control unit and the drivers controlled by that control unit are mounted on a printed circuit board, wherein the printed circuit board is mounted standing perpendicular on the base plate and the electric wiring from the each of the drivers to the electric devices when possible lies in a plane perpendicular to the base plate.

11. The panel according to claim 10, wherein the printed circuit board and the electric wiring are molded in by a suitable resin.

12. The panel according to claim 1, wherein the control unit comprises a communication unit and is connected to a connector set at each of the perimeter sides of the panel for connection to an adjacent panel.

13. A building structure comprising one or more panels according to claim 1, wherein the panels are placed in edge-to-edge formation in such an orientation, so that neighboring edges always are original edges of the non-adapted panel.

14. The building structure according to claim 13, wherein the panels are mutually self-configuring to a controllable structure.

* * * * *